Figure 1:
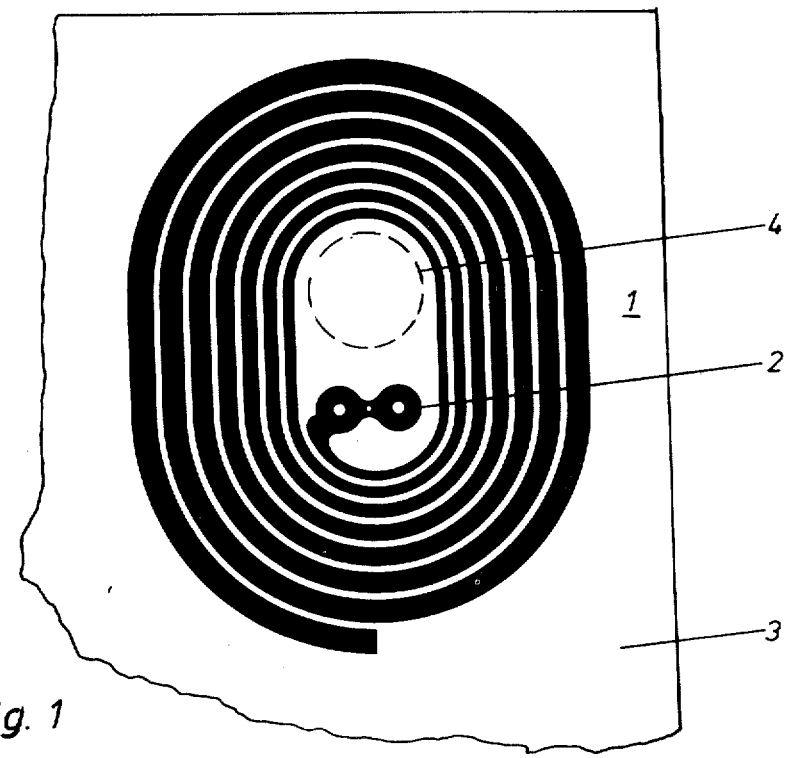

United States Patent
Haas

[11] 4,016,519
[45] Apr. 5, 1977

[54] PRINTED CIRCUIT COILS

[75] Inventor: Dieter Haas, Hildesheim, Germany

[73] Assignee: Blaupunkt-Werke GmbH, Hildesheim, Germany

[22] Filed: May 14, 1976

[21] Appl. No.: 686,520

[52] U.S. Cl. .............................. 336/200; 336/223; 336/228; 336/232

[51] Int. Cl.² ........................................ H01F 27/28

[58] Field of Search .......... 336/200, 223, 232, 228; 174/68.5; 317/101 R

[56] References Cited

UNITED STATES PATENTS 2,236,162  3/1941  Von Henke .................. 336/223
3,089,106  5/1963  Saaty ........................... 336/200

*Primary Examiner*—Thomas J. Kozma
*Attorney, Agent, or Firm*—William R. Woodward

[57] ABSTRACT

The conducting path width of a spiral printed circuit coil is reduced for the inside of the spiral coil to obtain more inductance in the same space without substantial sacrifice in Q. In another form of spiral coil with non-constant path width, the path width is reduced in a sector of the coil located between the inner and outer terminals to reduce the distance between terminals with minimum sacrifice in inductance or Q.

3 Claims, 2 Drawing Figures

PRINTED CIRCUIT COILS

This invention relates to a printed circuit coil of the spiral type. It is commonly regarded as impractical to produce inductive coils in integrated circuit technology under present techniques. In order to be able to produce inductances in a small space within small dimensional tolerances, coils have been made by printed circuit techniques for some time. Thus, a coil in the form of a flat spiral has been printed on an insulating carrier plate in the same way as circuit connection paths have been made for printed circuits. Such a coil can be made with turns printed either on one side or on both sides of the plate of insulating material.

The electrical magnitudes of such coils, for example the inductance or the Q are determined predominantly by the length of the winding, the path width, the spacing between adjacent paths and the average turn diameter. In the known forms of such coils, these parameters are selected at particular fixed values, so that for obtaining a particular inductance a certain space requirement, which can be calculated from the parameters, results. This space requirement of course can be limited by the apparatus dimensions and the resulting limitations on space available for the circuit board. There is the further problem in the case of coils printed on one side of the board, that one connection point of the coil is inside the coil and the other outside of it. It is often desirable to connect both of these connection points with a single component, for example a capacitor which forms a resonant circuit with the coil. This objective is often not obtainable, because the necessary inductance and Q of the coil requires a path width and a number of turns that results in a distance between the contact areas of the coil that far exceeds the usual spacing of component leads designed for printed circuits.

In consequence, in conventional production methods, coils of a particular Q for a prescribed space requirement can be made only up to a relatively low value of inductance that must not be exceeded. Otherwise stated, for a particular amount of available space, the Q of a coil can only be increased at the expense of inductance.

It is an object of the invention to provide printed circuit coils having a combination of electrical values exceeding the limits of those made by conventional methods.

SUBJECT MATTER OF THE INVENTION

Briefly, instead of utilizing spiral windings in which the conducting path is of constant width, the width of the conducting path in different portions of the winding is varied so as to make the most effective use of the available area on the insulating plate from the point of view of the electrical qualities of the coil. In one form of the invention, the path width of the spiral conductor of the coil decreases from the outside to the inside of the spiral, preferably decreasing from turn to turn from the outside to the inside of the coil. In another form of the invention, a sector of the coil including a portion of each complete turn passing through the sector is of narrower path width than the remainder of the coil. Preferably, this sector is located between the inner and outer contact areas for the ends of the coil and the conducting paths in this sector of the coil are straight and parallel to each other.

Printed circuit coils of the first-mentioned form of the invention designed for a prescribed space requirement have substantially higher Q than those of conventional design without any significant reduction of inductance. Printed circuit coils of the above-mentioned second form of the invention obtain inductance values of conventional coils with only slight sacrifice of Q, while obtaining the advantage that the required spacing between the coil end contact areas is substantially reduced.

Figure 2:
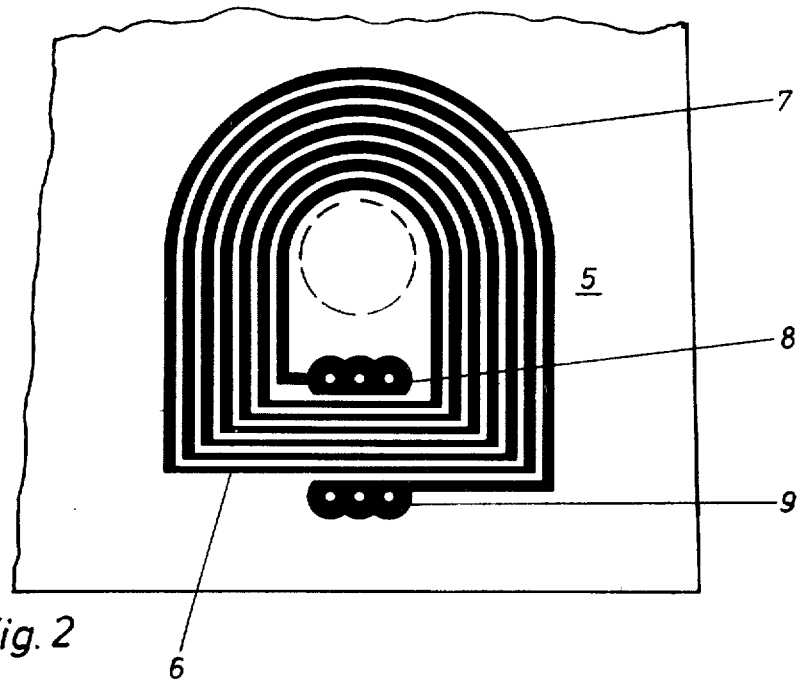

The invention is further described by way of illustrative example with reference to the accompanying drawing, in which:

FIG. 1 is a plan view of a printed circuit coil illustrating the first form of the invention, and FIG. 2 is a plan view of a printed circuit coil illustrating the second form of the invention.

The spiral printed circuit coil 1 shown in FIG. 1 has an inner contact area 2 from which the successive turns of the coil run in spiral configuration. The outer end of the coil 1 and its contact area are not shown in FIG. 1. The coil 1 has the overall shape of an oval. This shape is, of course, purely illustrative and other shapes such as circular, pear-shaped, etc., may be used to the same effect. The coil 1 is printed on an insulating plate 3 by any conventional method, as for example by applying a resist to the circuit areas by printing or photolithography and etching away the uncovered areas of an overall metal layer originally provided on the insulating plate, leaving a conducting path firmly bonded to the insulating plate. A hole 4 through the insulating plate is provided on the inside of the coil 1, for mounting a ferromagnetic core, as for example a ferrite core, for the coil. The insulating plate is also bored twice inside the contact area 2, in the illustrated example, so that it is possible to make two connections to the coil at this point, if desired.

For carrying out the invention, the turns of the coil 1 increase in width from the inside to the outside. The spacing between the individual turns is kept constant. For a minimum space requirement, the spacing between turns can be chosen as small as it can reliably be produced by the printed circuit technology utilized.

Compared to a conventionally printed coil, where the path width is constant for the entire winding, a higher Q can be obtained for about the same inductance, or a higher inductance can be obtained for substantially the same value of Q. The parameter Q is given by the formula $L\omega/R$ and hence corresponds, for a given frequency, to the ratio of inductance to internal resistance. A comparable Q can be obtained with a conventional coil only if its path width would correspond to that of the outer windings of the coil shown in FIG. 1. In the same space, therefore, only a substantially smaller inductance could be obtained. On the other hand, if a conventional coil were made with the conductor width of the inner windings of the coil shown in FIG. 1, it would have substantially smaller Q for the same value of inductance.

FIG. 2 shows a printed circuit coil designed for relatively close spacing of the inner and outer contact areas for the ends of the coil. The turns of the coil 5 shown in FIG. 2 have approximately the form of a half-oval. Thus, each of the turns can be regarded as made up of a straight portion and a half-oval portion, and the winding as a whole, can likewise be regarded as made up of two portions, a first sector 6 where the turns run exclusively straight and parallel to each other and the remaining larger sector 7, where they are in large part curved. The winding of the coil 5 still runs spirally from the inner contact area 8 to the outer contact area 9. The contact areas 8 and 9 for the ends of the coil are so placed that they are opposite each other on the sector 6, with the straight portion of the winding running between them. The coil 5 is of conventional design in the second and larger sector 7, which is to say that all turns have the same path width and the spacing between adjacent turns is constant. The path width and the radii of the turns are selected in accordance with conventional principles. The path width in the first sector 6, however, is substantially smaller than in the second sector 7. In this manner, it is possible to provide more turns between the contact areas 8 and 9 than by conventional design without increasing the spacing of the contact areas at negligible sacrifice in electrical qualities.

The spacing between contact areas 8 and 9 is often fixed by a raster or module design to suit a standard configuration of connection leads for components to be mounted on the circuit board. For a given coil Q, the inductance of the coil, such as the coil 5 shown in FIG. 2, can be substantially increased compared to the inductance of a conventional coil in which the same spacing between the inner and outer contact areas is provided. In an illustrative practical application, the inductance of the coil can be increased by 95%, with a reduction of Q by less than 2% by going from a conventional design to a design according to FIG. 2, for the same spacing between inner and outer terminal areas.

Although the invention has been described by way of particular illustrative embodiments for each of two forms of the invention, it will be understood that the advantages of the invention may be obtained by variations and modifications within the inventive concept. It is likewise possible to combine the features of both forms of the invention, as by providing a coil of the general configuration of FIG. 2 with a path width that decreases towards the inside of the coil, both with respect to the straight-path sector between the coil terminals and with respect to the remainder of the coil where each turn has a greater path width than the portion of the same path in the sector between the terminals.

I claim:

1. A printed circuit coil of spiral configuration on the surface of a plate of insulating material composed of a layer of conducting material in a continuous spiral path with a substantially constant spacing between adjacent turns thereof and incorporating the improvement wherein a sector of said spiral including a part of each complete turn passing thereacross is of smaller path width than the remainder of said spiral path.

2. A printed circuit coil as defined in claim 1, in which the portion of said spiral path in said sector with smaller path width is located between contact areas (8,9) respectively connecting with the ends of said spiral path.

3. A printed circuit coil as defined in claim 2, in which the portion of each turn passing through said sector and between said contact areas are straight and parallel to each other.

* * * * *